(12) United States Patent
Landers

(10) Patent No.: US 9,692,446 B2
(45) Date of Patent: Jun. 27, 2017

(54) DELTA-SIGMA ADC WITH WAIT-FOR-SYNC FEATURE

(71) Applicant: Texas Instruments Incorporated, Dallas, TX (US)

(72) Inventor: Robert James Landers, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/281,354

(22) Filed: Sep. 30, 2016

(65) Prior Publication Data

US 2017/0134039 A1    May 11, 2017

Related U.S. Application Data

(60) Provisional application No. 62/253,922, filed on Nov. 11, 2015.

(51) Int. Cl.
*H03M 3/00* (2006.01)
*G06F 13/24* (2006.01)
*G06F 13/16* (2006.01)

(52) U.S. Cl.
CPC ........ *H03M 3/462* (2013.01); *G06F 13/1673* (2013.01); *G06F 13/1689* (2013.01); *G06F 13/24* (2013.01)

(58) Field of Classification Search
CPC .......... H03M 3/462; H03M 3/30; H03M 3/50; H03M 7/3004; G06F 13/1689; G06F 13/24

USPC .................................................. 341/143, 155
See application file for complete search history.

(56) References Cited

U.S. PATENT DOCUMENTS

| 5,594,612 | A | * | 1/1997 | Henrion | H03M 1/1038 324/620 |
| 5,621,675 | A | * | 4/1997 | Linz | G06F 7/026 708/313 |
| 5,646,621 | A | * | 7/1997 | Cabler | G06F 7/026 341/143 |
| 7,733,151 | B1 | * | 6/2010 | Yu | G06F 1/08 327/156 |

* cited by examiner

*Primary Examiner* — Jean B Jeanglaude
(74) *Attorney, Agent, or Firm* — John R. Pessetto; Charles A. Brill; Frank D. Cimino

(57) ABSTRACT

An integrated circuit (IC) chip containing a Delta-Sigma ($\Delta\Sigma$) filter module for a $\Delta\Sigma$ analog-to-digital converter and a method of providing analog to digital conversion are disclosed. The IC chip includes a $\Delta\Sigma$ filter that is connected to receive a digital data stream created by a $\Delta\Sigma$ modulator, provide a multibit data value when a counter reaches a selected number of received bits, and reset the counter responsive to receiving a synchronization pulse. The IC chip also includes a FIFO buffer connected to store the multibit data value only when a synchronization flag is on and to send an interrupt towards a processing unit only after storing a selected number of multibit data values. The IC chip further includes a synchronization module connected to turn on the synchronization flag responsive to receiving the synchronization pulse and to turn off the synchronization flag responsive to the sending of the interrupt.

11 Claims, 4 Drawing Sheets

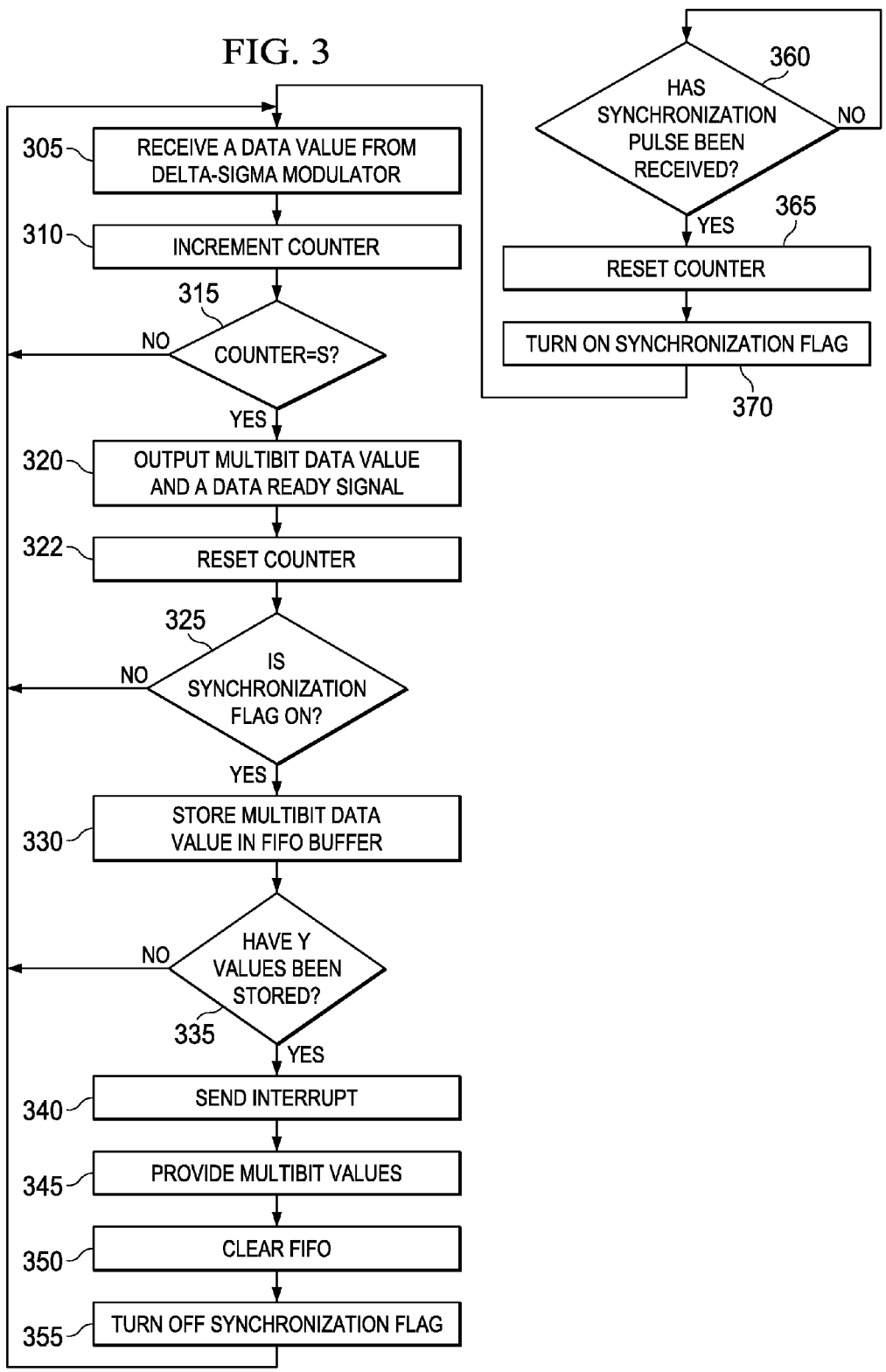

DELTA-SIGMA ADC WITH WAIT-FOR-SYNC FEATURE

CLAIM OF PRIORITY AND RELATED PATENT APPLICATIONS

This nonprovisional application claims priority based upon the following prior U.S. provisional patent application(s): (i) "Sigma-Delta Wait-for-Sync Feature," Application No. 62/253,922, filed Nov. 11, 2015, in the name(s) of Robert Landers; which is hereby incorporated by reference in its entirety.

FIELD OF THE DISCLOSURE

Disclosed embodiments relate generally to the field of Delta-Sigma analog-to-digital converters (ADCs), also referred to as Sigma-Delta ADCs. More particularly, and not by way of any limitation, the present disclosure is directed to a Delta-Sigma ADC with a wait-for-sync feature.

BACKGROUND

Delta-Sigma ($\Delta\Sigma$) ADCs generate a continuous stream of output values irrespective of the actual needs of a control algorithm. Because of the continuous generation of output, it is not uncommon that many samples are discarded as unnecessary. However, regardless of whether the sample is used or not, each sample generates an interrupt to a central processing unit (CPU) or Microprocessor unit (MPU), which results in wasted cycles servicing an interrupt service request (ISR) that provides no benefit. When a Delta-Sigma ADC is used for motor control, typically three to ten interrupts occur per pulse width modulation (PWM) cycle, many or most of which are not necessary.

Previously, a small amount of code has been used at the processing unit to keep track of unwanted samples and free the processing unit as quickly as possible. Alternatively, a small first-in first-out (FIFO) buffer has been used to collect a given number of samples before generating an interrupt, which allows fewer interrupts but does not deal with the problem of sending data that will only be discarded. It would be desirable to provide a method of interrupting the CPU/MPU only when useful work can be accomplished.

SUMMARY

Disclosed embodiments use an external synchronization signal, a small FIFO buffer and associated circuitry that ignores all samples prior to the synchronization pulse and then interrupts only at the completion of a given number of samples after that pulse. When the synchronization signal is referenced to the PWM cycle, an embodiment can result in a single interrupt per PWM cycle instead of many interrupts. A user can specify where in the PWM cycle desired data is located and receive only the desired data.

In one aspect, an embodiment of an integrated circuit (IC) chip containing a Delta-Sigma filter module (DSFM) for a Delta-Sigma analog-to-digital converter is disclosed. The IC chip includes a Delta-Sigma filter connected to receive a digital data stream created by a Delta-Sigma modulator, provide a multibit data value when a counter reaches a selected number of received bits, and reset said counter responsive to receiving a synchronization pulse; a first-in, first-out (FIFO) buffer connected to store said multibit data value only when a synchronization flag is on and to send an interrupt towards a processing unit only after storing a selected number of said multibit data values; and a synchronization module connected to turn on said synchronization flag responsive to receiving said synchronization pulse and to turn off said synchronization flag responsive to the sending of said interrupt.

In another aspect, an embodiment of a method of providing analog to digital (ADC) conversion is disclosed. The method includes receiving, at a Delta-Sigma ($\Delta\Sigma$) filter for a $\Delta\Sigma$ analog-to-digital (ADC) converter, a stream of digital data from a $\Delta\Sigma$ modulator and providing a multibit data value and a data-ready signal when a counter reaches a given value; storing said multibit data value in a first-in first-out (FIFO) buffer only if a synchronization flag is turned on; responsive to receiving a synchronization pulse at said $\Delta\Sigma$ filter, resetting said counter to zero, and turning on said synchronization flag; and responsive to storing a selected number of multibit data values in said FIFO buffer, sending an interrupt towards a processing unit and turning off said synchronization flag.

BRIEF DESCRIPTION OF THE DRAWINGS

Embodiments of the present disclosure are illustrated by way of example, and not by way of limitation, in the figures of the accompanying drawings in which like references indicate similar elements. It should be noted that different references to "an" or "one" embodiment in this disclosure are not necessarily to the same embodiment, and such references may mean at least one. Further, when a particular feature, structure, or characteristic is described in connection with an embodiment, it is submitted that it is within the knowledge of one skilled in the art to effect such feature, structure, or characteristic in connection with other embodiments whether or not explicitly described.

Additionally, terms such as "coupled" and "connected," along with their derivatives, may be used in the following description, claims, or both. It should be understood that these terms are not necessarily intended as synonyms for each other. "Coupled" may be used to indicate that two or more elements, which may or may not be in direct physical or electrical contact with each other, co-operate or interact with each other. "Connected" may be used to indicate the establishment of communication, i.e., a communicative relationship, between two or more elements that are coupled with each other. Further, in one or more example embodiments set forth herein, generally speaking, an element, component or module may be configured to perform a function if the element is capable of performing or otherwise structurally arranged to perform that function.

Figure 1:
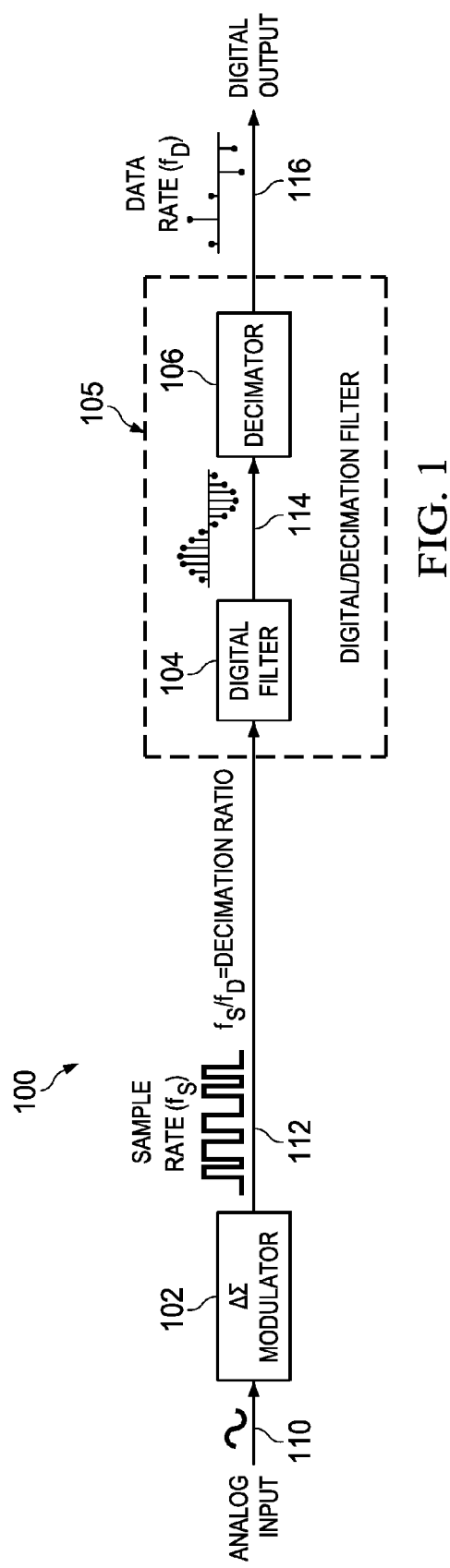
Figure 2A:
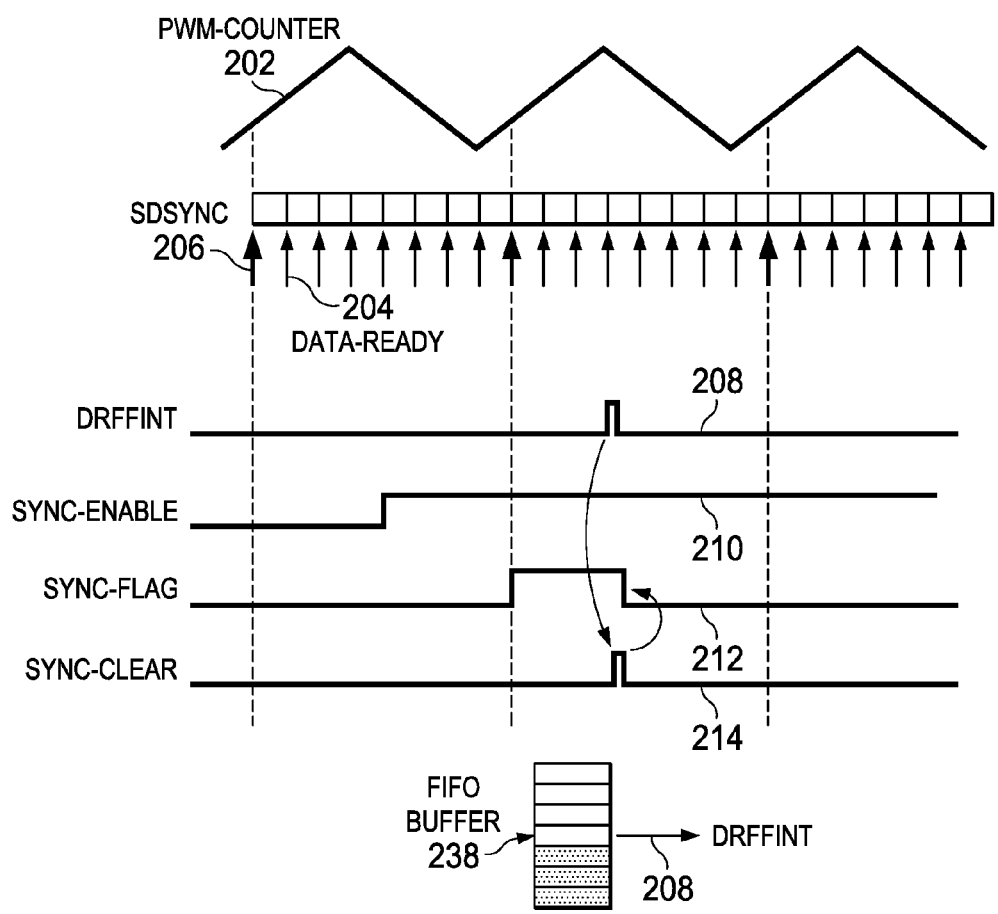
Figure 2B:
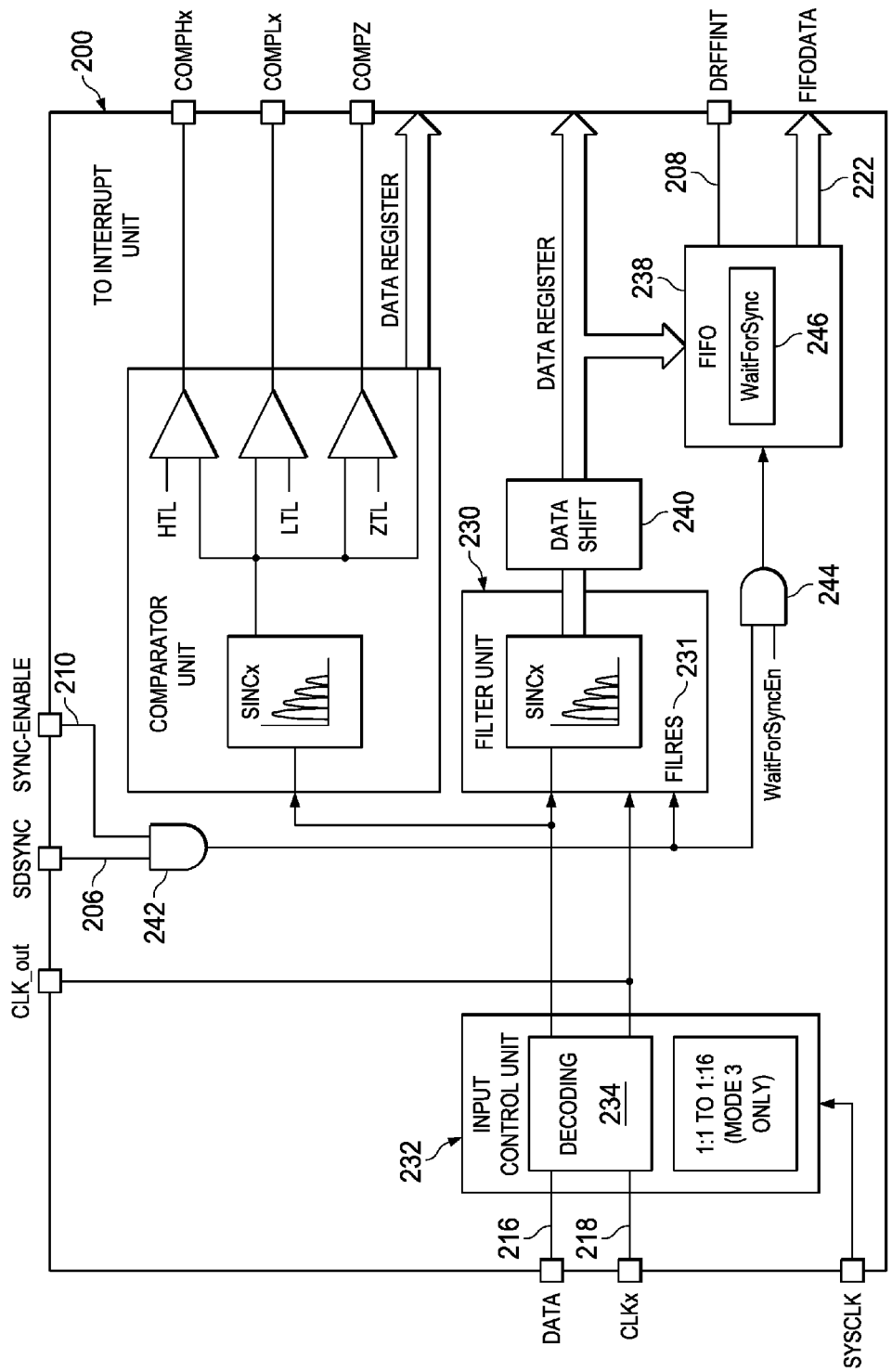

The accompanying drawings are incorporated into and form a part of the specification to illustrate one or more exemplary embodiments of the present disclosure. Various advantages and features of the disclosure will be understood from the following Detailed Description taken in connection with the appended claims and with reference to the attached drawing figures in which:

FIG. 1 depicts a schematic diagram of a Delta-Sigma ADC and the data signal as the signal passes through different stages in the Delta-Sigma ADC;

FIG. 2A depicts an example of various signals associated with a Delta-Sigma ADC according to an embodiment of the disclosure;

FIG. 2B depicts an integrated circuit chip that includes a Delta-Sigma filter according to an embodiment of the disclosure; and FIG. 3 illustrates a method for providing analog to digital conversion results to a processing unit according to an embodiment of the disclosure.

DETAILED DESCRIPTION OF THE DRAWINGS

Specific embodiments of the invention will now be described in detail with reference to the accompanying figures. In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

Turning first to FIG. 1, a schematic diagram of a Delta-Sigma ADC is shown. Delta-Sigma ADC 100 is a 1-bit sampling system and includes two main elements: modulator 102 and digital/decimation filter 105, also referred to herein as a Delta-Sigma filter module, which is composed of digital filter 104 and decimator 106. Analog data signal 110 is applied to the input of ΔΣ ADC 100. ΔΣ modulator 102 coarsely samples input signal 110 at a very high rate into a 1-bit intermediate stream 112, which as can be seen is a stream of ones and zeros, with the density of the ones and zeros carrying information about the original signal. Modulator 102 shapes the signal to allow high resolution by shifting the noise to a higher frequency and reducing low-frequency noise. Once the signal resides in the digital domain, digital filter 104 provides a low-pass filter function to attenuate the high-frequency noise and produce signal 114, then decimator 106 slows down the output-data rate to output signal 116. Although digital filter 104 and decimator 106 are shown as separate entities, these functions are often not distinct circuits when realized in silicon. It can be noted that in other embodiments, Delta-Sigma modulator 102 can have multi-bit outputs, e.g., from two to four-bits. It will also be understood that the blocks shown in this figure are provided as examples only and may not represent specific implementations. For example, blocks can be combined or arranged in way other than those shown in this figure without affecting the workability of the disclosed embodiments.

In FIG. 2A, PWM counter 202 is a signal to which the interrupts are to be synchronized, which in at least one embodiment is a counter associated with a pulse width modulation signal. Data ready pulses 204, shown as smaller arrows, indicate when a new multibit value is ready to be provided to the CPU and are generally provided every time an internal counter reaches a threshold value. It will be noted that although PWM counter 202 and data ready pulses 204 are shown in this figure as having a constant relationship, such a constant relationship does not generally occur in practice. Instead, this relationship can be quite variable over time. However, it is desirable that the sample provided to the CPU is always taken at a specific point in the PWM cycle. In order to achieve this relationship, PWM counter 202, which is provided by pulse-width modulation, is used to generate synchronization signal, SDSYNC 206 such that SDSYNC 206 provides a pulse (shown as the larger arrows) at the same point in each PWM cycle. When a synchronization pulse is received at the filter, the counter that determines how often a sample is taken is reset to zero. The combination of synchronization signal 206 and filter reset ensures that the samples will be taken in a fixed relationship to the PWM signal.

In addition to synchronization signal SDSYNC 206, an enable signal, SYNC-ENABLE 210, can be turned on to activate the wait-for-sync feature. When SYNC-ENABLE 210 is turned on, data that is processed by the filter prior to a synchronization pulse is not sent to the processing unit but will be ignored at FIFO buffer 238. Then, once a synchronization pulse is received, SYNC-FLAG 212 is turned on to instruct FIFO buffer to start storing the multibit outputs. After a configurable number of data values associated with data-ready pulses 204 are received in FIFO buffer 238, interrupt DRFFINT 208 is sent to an interrupt unit for the CPU/MPU.

In addition to providing notice of data to the CPU, DRFFINT 208 also causes the signal SYNC-CLEAR 214 to be asserted. SYNC-CLEAR 214 in turn causes SYNC-FLAG 212 to be turned off, which stops further multibit outputs from being stored in the FIFO buffer until a new synchronization pulse is received. The result of the disclosed signals is that only a desired fraction of the output of the Delta-Sigma filter is stored in FIFO buffer 238 for sending to the CPU and this desired fraction is provided by a single interrupt per PWM cycle. This means that much less of the CPU's time is taken up with discarding unwanted data. It will be understood that when DRFFINT 208 is sent to the CPU, all available values that are stored in the FIFO buffer are made available to the CPU. Depending on programming, the CPU can then retrieve single or multiple values from the FIFO buffer.

FIG. 2B depicts an integrated circuit (IC) chip 200 that contains a Delta-Sigma filter according to an embodiment of the disclosure. It will be understood that the components shown in this embodiment can be part of a stand-alone chip or may be integrated into other integrated circuits. IC chip 200 receives data signal 216 from a Delta-Sigma modulator, such as modulator 102. Both data signal 216 and clock signal CLKx 218 are received in input control unit 232, pass through decoding module 234 and are sent to Delta-Sigma filter 230. Filter unit 230 provides multibit output data to data shift module 240, which can provide this data to FIFO buffer 238. In addition to data signal 216, IC chip 200 also receives synchronization signal SDSYNC 206, which provides synchronization pulses, and SYNC-ENABLE 210. These two signals are provided to AND gate 242 such that when SYNC-ENABLE 210 is turned on, synchronization signal SDSYNC 206 is provided to Delta-Sigma filter 230. At Delta-Sigma filter 230, each synchronization pulse triggers a filter reset 231, which resets the counter to ensure that any subsequent data collected will have the desired relationship to the PWM cycle (or other outside signal).

In the specific embodiment shown, even when SDSYNC 206 is being provided to the chip, a further decision can be made whether or not to utilize the wait-for-sync feature. To this end, SDSYNC 206 is also provided to AND gate 244, where this signal is combined with a further enable signal, WAITFORSYNCEN. When this further synchronization enable signal is turned on, the Wait-For-Sync feature is active at FIFO buffer 238. Wait-for-Sync module 246 is shown in the disclosed embodiment as a part of FIFO buffer 238, but it will be recognized that this module can be located elsewhere on Chip 200. Each time a synchronization pulse is received at Wait-for-Sync module 246, SYNC-FLAG (not specifically shown) is turned on; once an interrupt has been sent to the processing unit, SYNC-FLAG is turned off. The SYNC-FLAG is made available to FIFO buffer 238, so that FIFO buffer 238 knows when to store the multibit outputs provided by Delta-Sigma filter 230. As noted previously, a determination of how long after the receipt of synchronization filter an interrupt is sent is configurable. In at least one embodiment, the user is able to designate a specific number of data-ready signals that should be received at FIFO buffer 238 before data ready from FIFO interrupt DRFFINT 208 is sent. The ability to configure the chip as noted is not specifically shown in this figure, but can be provided in a known manner, such as via a pin input or written to a non-volatile memory location on IC chip 200 during manufacture or programming.

FIG. 3 depicts a method of providing analog to digital (ADC) conversion according to an embodiment of the disclosure. In this figure, the method begins by receiving (305) a data value from a Delta-Sigma modulator, such as ΔΣ modulator 102. As noted previously, the data value may be a single bit of data or may be from two to four bits; a clock signal is also received to enable the detection of where one bit ends and another begins. As each bit of data is received, a counter is incremented (310). The filter, which in one embodiment is filter 230, will read and process a selected number, S, of bits of data before providing an output, so a determination is made whether S bits have been read, i.e., is the counter equal (315) to S. If not, the module continues to receive data bits, but if the counter is equal to S, the filter outputs (320) both a multibit data value that represents the value of these bits and a data-ready signal; the counter is also reset (322).

After a multibit data value is provided, a determination is made (325) whether the synchronization flag is on. If the synchronization flag is on, the newly created multibit value is stored (330) in the FIFO buffer; otherwise the method simply returns to receive further data. Once the multibit data value is stored, the method determines (335) whether the configurable number of values "Y" have been stored. If the configurable number of values have not been stored, the method returns to receive further data, but if the configurable number of values have been stored, the method sends (340) interrupt DRFFINT. This interrupt is sent toward the CPU or MPU, but may first go to an interrupt handler in route. Once the interrupt is sent, the stored multibit values in the FIFO buffer are provided (345) to the CPU or MPU as desired, i.e., either a single value or as many as requested. Afterwards, the FIFO buffer is cleared (350) to prepare for the next data to be sent to the CPU/MPU, the synchronization flag is turned off (355) and the method returns to receive further data from the ΔΣ modulator.

At the same time this cycle is occurring, a determination is made whether a synchronization pulse has been received (360). If not, the method waits until a synchronization pulse has been received and then resets (365) the counter in the filter. This means that the collection of bits from the modulator is also reset/restarted, no matter where in a cycle the filter was currently operating. At the same time, the synchronization flag is turned (370) on to begin storing multibit data values in the FIFO and the method goes to receive a new bit of data from the ΔΣ modulator.

Although various embodiments have been shown and described in detail, the claims are not limited to any particular embodiment or example. None of the above Detailed Description should be read as implying that any particular component, element, step, act, or function is essential such that it must be included in the scope of the claims. Reference to an element in the singular is not intended to mean "one and only one" unless explicitly so stated, but rather "one or more." All structural and functional equivalents to the elements of the above-described embodiments that are known to those of ordinary skill in the art are expressly incorporated herein by reference and are intended to be encompassed by the present claims. Accordingly, those skilled in the art will recognize that the exemplary embodiments described herein can be practiced with various modifications and alterations within the spirit and scope of the claims appended below.

What is claimed is:

1. An integrated circuit (IC) chip containing a Delta-Sigma filter module (DSFM) for a Delta-Sigma analog-to-digital converter, said DSFM comprising:
a Delta-Sigma filter connected to receive a digital data stream created by a Delta-Sigma modulator, provide a multibit data value when a counter reaches a selected number of received bits, and reset said counter responsive to receiving a synchronization pulse;
a first-in, first-out (FIFO) buffer connected to store said multibit data value only when a synchronization flag is on and to send an interrupt towards a processing unit only after storing a selected number of said multibit data values; and
a synchronization module connected to turn on said synchronization flag responsive to receiving said synchronization pulse and to turn off said synchronization flag responsive to the sending of said interrupt.

2. The IC chip as recited in claim 1 wherein said FIFO buffer is connected, responsive to sending said interrupt, to provide said multibit data values stored in said FIFO to the processing unit.

3. The IC chip as recited in claim 2 wherein said FIFO buffer is further connected to be cleared after providing said multibit outputs to said processing unit.

4. The IC chip as recited in claim 3 wherein said synchronization pulse is synchronized to a control signal.

5. The IC chip as recited in claim 4 wherein said control signal is related to a pulse width modulation signal.

6. The IC chip as recited in claim 5 wherein said selected number is configurable.

7. A method of providing analog to digital (ADC) conversion comprising:
receiving, at a Delta-Sigma (ΔΣ) filter for a ΔΣ analog-to-digital (ADC) converter, a stream of digital data from a ΔΣ modulator and providing a multibit data value and a data-ready signal when a counter reaches a given value;
storing said multibit data value in a first-in first-out (FIFO) buffer only if a synchronization flag is turned on;
responsive to receiving a synchronization pulse at said ΔΣ filter, resetting said counter to zero, and turning on said synchronization flag; and
responsive to storing a selected number of multibit data values in said FIFO buffer, sending an interrupt towards a processing unit and turning off said synchronization flag.

8. The method of providing ADC conversion as recited in claim 7 further comprising responsive to sending said interrupt towards said processing unit, providing said multibit data values in said FIFO buffer to said processing unit.

9. The method of providing ADC conversion as recited in claim 8 further comprising clearing said FIFO buffer after providing said multibit data values to said processing unit.

10. The method of providing analog to digital conversion results as recited in claim 9 wherein said synchronization pulses are synchronized to a control signal.

11. The method of providing ADC conversion as recited in claim 10 wherein said control signal is a pulse width modulation signal.

* * * * *